(12) United States Patent
Wu et al.

(10) Patent No.: US 12,267,983 B2
(45) Date of Patent: Apr. 1, 2025

(54) IMPELLER, FAN AND ELECTRONIC DEVICE

(71) Applicant: StonePlus Thermal Management Technologies Limited, Guangdong (CN)

(72) Inventors: Hsiu-Wei Wu, Guangdong (CN); En-Yu Lin, Guangdong (CN); Zhongqi Zhou, Guangdong (CN)

(73) Assignee: STONEPLUS THERMAL MANAGEMENT TECHNOLOGIES LIMITED, Shenzhen (CN)

( * ) Notice: Subject to any disclaimer, the term of this patent is extended or adjusted under 35 U.S.C. 154(b) by 0 days.

(21) Appl. No.: 18/436,716

(22) Filed: Feb. 8, 2024

(65) Prior Publication Data

US 2024/0244788 A1 Jul. 18, 2024

(30) Foreign Application Priority Data

Oct. 23, 2023 (CN) .......................... 202322853783.5

(51) Int. Cl.
*H05K 7/20* (2006.01)
*F04D 17/00* (2006.01)
*F04D 29/28* (2006.01)
*F04D 29/66* (2006.01)

(52) U.S. Cl.
CPC ......... *H05K 7/20136* (2013.01); *F04D 17/00* (2013.01); *F04D 29/281* (2013.01); *F04D 29/666* (2013.01)

(58) Field of Classification Search
CPC ........ F04D 29/28; F04D 29/281; F04D 29/30; F04D 29/327; F04D 29/66; F04D 29/666; F04D 29/661; F04D 17/00; H05K 7/20136
See application file for complete search history.

(56) References Cited

U.S. PATENT DOCUMENTS

| | | | | |
|---|---|---|---|---|
| 1,249,692 | A * | 12/1917 | Upton | F04D 29/281 415/199.1 |
| 1,893,184 | A * | 1/1933 | Smellie | F04D 29/666 181/209 |
| 5,000,660 | A * | 3/1991 | Van Houten | F04D 29/386 416/175 |
| 6,488,472 | B1* | 12/2002 | Miyazawa | F04D 29/662 416/237 |
| 11,255,341 | B1* | 2/2022 | Cheng | F04D 29/30 |

(Continued)

FOREIGN PATENT DOCUMENTS

| | | |
|---|---|---|
| CN | 106032807 A | 10/2016 |
| CN | 214617146 U | 11/2021 |

*Primary Examiner* — Elton K Wong
(74) *Attorney, Agent, or Firm* — SHIMOKAJI IP

(57) ABSTRACT

An impeller with different blades with different lengths for suppressing noise is disclosed. The impeller includes a fan hub and a plurality of blades. The blades are positioned at intervals around the fan hub and arranged in a circular array. The blades extend radially from the fan hub, and two opposite ends of each of the blades are a root portion and a head portion respectively. All root portions of the blades are connected to a peripheral side of the fan hub, and all head portions of the blades are located on a same circle. Every two adjacent blades are different in length in a longitudinal direction from the root portion thereof to the head portion thereof.

16 Claims, 9 Drawing Sheets
(3 of 9 Drawing Sheet(s) Filed in Color)

(56) References Cited

U.S. PATENT DOCUMENTS

| | | | | |
|---|---|---|---|---|
| 2012/0114512 A1* | 5/2012 | Lofy | ........................ | F04D 25/08 417/410.1 |
| 2012/0321493 A1* | 12/2012 | Duke | ..................... | F04D 29/281 417/423.7 |
| 2014/0127029 A1* | 5/2014 | Yang | ..................... | F04D 29/281 416/223 B |

* cited by examiner

IMPELLER, FAN AND ELECTRONIC DEVICE

FIELD OF THE INVENTION

The present invention relates to heat dissipation equipment, particularly to an impeller, a fan having the impeller, and an electronic device using the fan.

BACKGROUND OF THE INVENTION

Many electronic devices include fans, which are used to dissipate heat from heating components of the electronic devices. For some electronic devices, such as laptop computers and industrial equipments, when the temperature of the heating element (such as CPU) increases, the corresponding cooling capacity of the fan must be improved. However, this will indirectly lead to high noise, so there is a high demand for the silent performance of the fan.

The core component of the fan is the impeller. Referring to FIG. 4, the impeller includes a fan hub 07 and multiple blades 08 arranged on the fan hub 07. One end of the blade 08 is connected to the fan hub 07, and the other end of the blade 08 extends radially outward. The blades 08 are evenly distributed, and all the blades 08 are of equal length. The width of the opening 09 enclosed between every two adjacent blades 08 is basically equal. Therefore, all the openings 09 are evenly ventilated. However, this will cause the noise generated from each opening 09 during ventilation to overlap with each other, resulting in loud noise.

Moreover, due to the limitation of manufacturing process, the existing blades are thick, and it is difficult to increase the number of the blades of the impeller. For the fan, the more blades of the impeller there are, the greater the air flows, and the better the heat dissipation effects.

Therefore, it is urgent to provide an improved impeller, a fan, and an electronic device that can increase the number of blades and suppress noise to overcome the above-mentioned defects.

SUMMARY OF THE INVENTION

An objective of the present invention is to provide an impeller that can increase the number of blades with varying lengths and suppress noise.

Another objective of the present application is to provide a fan having an impeller that can increase the number of blades with varying lengths and suppress noise.

Another objective of the present application is to provide an electronic device using a fan with an impeller that can increase the number of blades with varying lengths and suppress noise.

In order to achieve the first purpose mentioned above, the present invention provides an impeller including a fan hub and a plurality of blades. The blades are positioned at intervals around the fan hub and arranged in a circular array, and extend radially outward from the fan hub. Two opposite ends of each of the blades are a root portion and a head portion respectively. All root portions of the blades are connected to a peripheral side of the fan hub, and all head portions of the blades are located on a same circle. Every two adjacent blades of the blades are different in length in a longitudinal direction from the root portion thereof to the head portion thereof.

Preferably, an outlet is defined between the head portions of every two adjacent blades of said blades, and any two adjacent outlets are different in width in a circumferential direction.

Preferably, each of the blades comprises a first structural part extending along a first direction and a second structural part extending from an end of the first structural part to a second direction, and the first direction is different from the second direction.

Preferably, a length ratio of the two adjacent blades is A/B, where a value of A ranges from 102 to 110, and a value of B is 100.

Preferably, the two adjacent outlets are named as a first outlet and a second outlet respectively, a width ratio of the first outlet and the second outlet is C/D, where a value of C ranges from 55 to 75, and a value of D ranges from 25 to 45.

Preferably, a thickness of each of the blades is in a range from 0.08 mm to 2.0 mm.

Preferably, one of the two adjacent blades is straight or curved, and the other of the two adjacent blades is curved.

Preferably, the blades have three or more different lengths.

Preferably, the blades with different lengths have the same number.

Preferably, the impeller further includes a wheel ring. The wheel ring is connected to the fan hub through the blades and encloses the fan hub on an outer circumference thereof. The blades are connected to an inner surface of the wheel ring. The wheel ring, the fan hub, and the blades are formed into an integrated structure.

In the prior art, the all blades have the same length, and the outlets between every two adjacent blades roughly have the same width, thus the air velocities of the two adjacent blades are the same, which leads to uniform air-out in the radial direction and the same intensity of the air flowing at each outlet. In contrast, the present invention is completely different. Due to the different lengths of every two adjacent blades, the uniform air-out in the radial direction is broken. In other words, the uniform air-out in the radial direction is weakened. The first outlet defined between the blade and the front adjacent blade thereof is wider, while the second outlet defined between the blade and the rear adjacent blade thereof is narrower, so the air velocity from the first outlet is relatively low, while the air velocity from the second outlet is relatively high. Thus, it can be seen that the air velocity around the impeller is distributed in a "weak-strong-weak-strong . . . " mode, breaking the uniformity of the air-out and resulting in differences in air velocity. After testing, it is found that this effectively reduces the frequency of noise generated during the impeller operation and suppresses noise. Therefore, the thickness of the blade can be reduced and the blades with different lengths can be increased by taking advantages of above-mentioned features. Compared to the conventional impeller with the same size, the improved impeller has an increased number of blades, the uniformity of the air-out between the blades is weakened, and more air volume is generated during operation, which meets the increasing heat dissipation requirement of current lightweight and slender products. Furthermore, the noise frequency of the improved impeller is not increased, thereby achieving better effects.

To achieve another purpose mentioned above, the present invention provides a fan including an impeller as described above and a motor with a shaft to drive the impeller rotation.

To achieve another purpose mentioned above, the present invention provides a heating device and a fan as described above.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF ILLUSTRATED EMBODIMENTS

To provide a detailed explanation of the technical content, and structural features of the present invention, the following is further explained in conjunction with the implementation method and the accompanying drawings.

The present invention provides an electronic device, which includes but is not limited to mobile Wi-Fi, power banks, mobile phones, laptops/tablets, wearable devices (virtual enhanced display glasses, augmented reality glasses, smartwatches, etc.), smart screen devices, in car devices (such as car phones), industrial devices, etc.

In one embodiment, the electronic device is a laptop including a casing, heating devices, and a fan. The heating devices and the fan are installed inside the casing. The heating devices include a CPU processor, a Northbridge chip, a memory, and a graphics card, which is not limited however. Fans are mainly used to dissipate heat from the heating devices, avoiding the impact of high temperatures on performance. The fan can be installed according to the positions of the heating devices and can be installed in a tight and close manner. The fan provided in the present invention includes a motor and an impeller. The motor drives the impeller to rotate to guide the air to flow through the heating devices, thereby dissipating heat from the heating devices. The motor is well-known to technical personnel in this field, so it will not be repeated here. The present invention mainly improves the structure of impeller 10, so the following focuses on explaining the structure of impeller 10.

Figure 1:
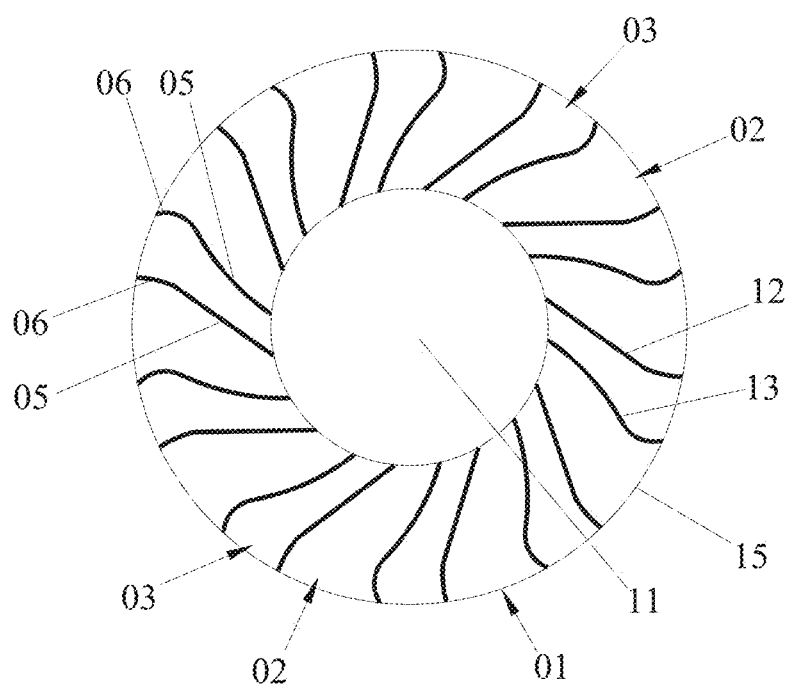
FIG. 1 is a schematic view of an impeller according to a first embodiment of the present invention.
Figure 2:
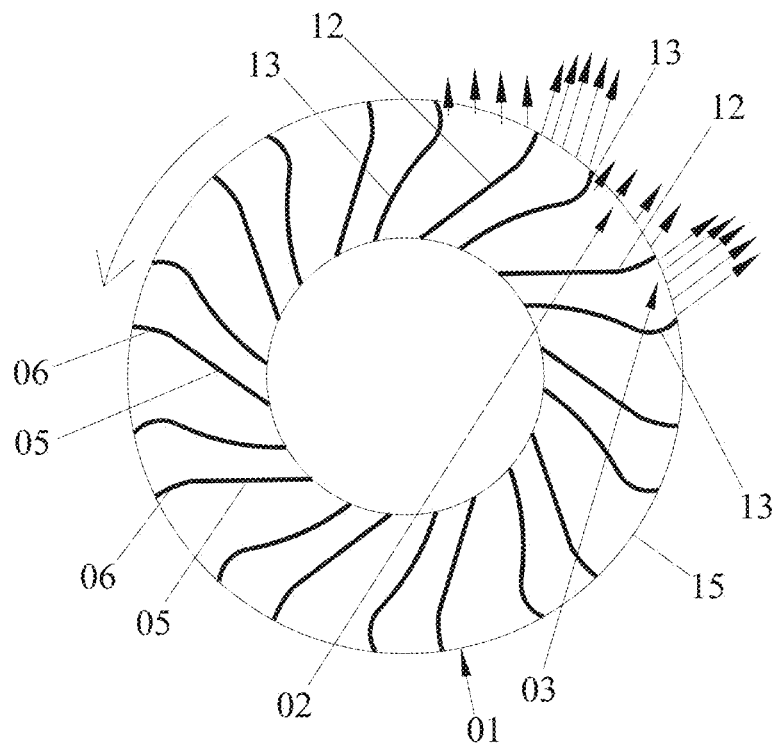
FIG. 2 is a diagrammatic representation of rotating the impeller of FIG. 1.

Referring to FIG. 1 and FIG. 2, the impeller 10 according to the first embodiment of the present invention includes a fan hub 11 and a plurality of blades 12 (13). The blades 12 (13) are arranged in intervals around the fan hub 11 and extend radially outward from the fan hub 11. Two opposite ends of each blade 12 (13) are a root portion and a head portion respectively. The root portions of all the blades 12 (13) are connected to a peripheral side of the fan hub 11, the head portions of all the blades 12 (13) are all located on a same circle 01. Lengths of the two adjacent blades 12 (13) are different. The following illustrates the structure of the impeller 10 of the present invention with the assistance of the first embodiment. The impeller 10 includes a plurality of blades, including two types. One type is the first blades 12 and the other type is the second blades 13. The first blades 12 and the second blades 13 both extend radially outward from the fan hub 11. Meanwhile, the first blades 12 and the second blades 13 roughly resemble a "spoke" structure. The root portions of the first blades 12 and the root portions of the second blade 13 are both connected to the peripheral side of the fan hub 11, and the head portions of the first blades 12 and the head portions of the second blades 13 are all on the same circle 01. The length of the first blade 12 is greater than the length of the second blade 13.

Figure 4:
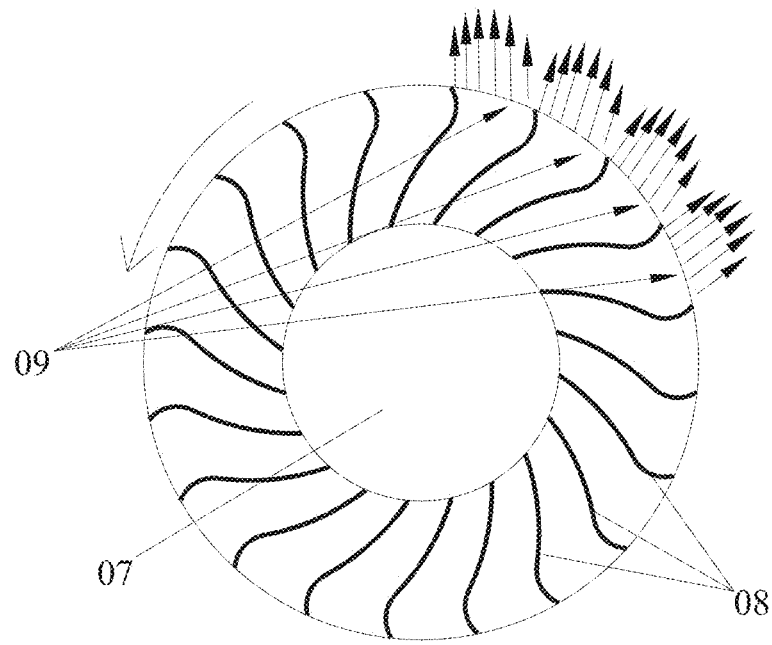
FIG. 4 is a schematic view showing rotation of the existing impeller according to the prior art.

In the prior art, the all blades have the same length, and the outlets between every two adjacent blades roughly have the same width, thus the air velocities of the two adjacent blades are the same, which leads to uniform air-out in the radial direction and the same intensity of the air flowing at each outlet, as shown in FIG. 4, Instead, in the present invention, due to the different lengths of the first blade 12 and second blade 13, the existing uniformity of the air-out in the radial direction is broken, and the uniformity of the air-out in the radial direction is weakened. Referring to FIG. 2, an outlet is defined between the head portions of every two adjacent blades, and any two adjacent outlets are different in width in a circumferential direction. For example, as shown, a first outlet 02 is defined between the second blade 13 and the front adjacent first blade 12, a second outlet 03 is defined between the second blade 13 and the rear adjacent first blade 12, the first outlet 02 and the second outlet 03 are adjacent with one another. Specifically, the first outlet 02 is wider, and the second outlet 03 is narrowed in the circumferential direction. The air velocity from the first outlet 02 is relatively low, while the air velocity from the second outlet 03 is relatively high. Therefore, the air velocity around the impeller 10 is distributed in a "weak-strong-weak-strong . . . " mode, breaking the uniformity of the air-out and resulting in differences in air velocity. After testing, this effectively reduces the frequency of noise generated during the impeller operation and suppresses noise. Therefore, by taking advantages of these features, we reduce the thickness of the blades and increase some blades with different lengths. Compared to the conventional impeller with the same size, the uniformity of the air-out between the blades is weakened, and more air volume is generated during operation, which meets the increasing heat dissipation requirement of current lightweight and slender products. Furthermore, the noise frequency of the improved impeller is not increased, thereby achieving better effects.

Figure 3:
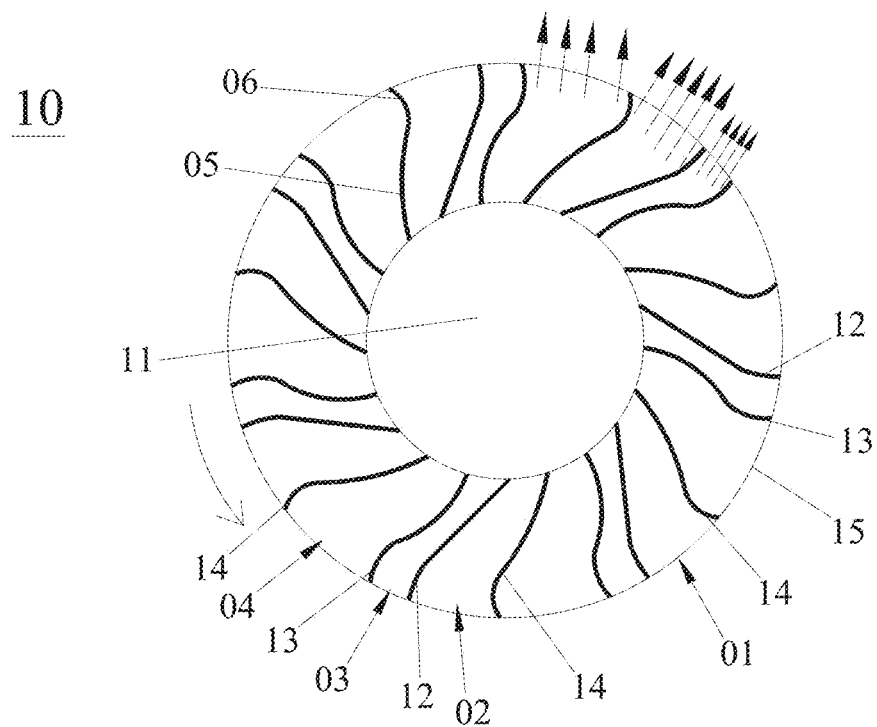
FIG. 3 is a schematic view of the impeller according to a second embodiment of the present invention and showing rotation of the impeller.

As seen, two different lengths of blades are configured in the above first embodiment, but it's optional to configure more different lengths of blades, such as 3, 4, 5, etc. For example, another impeller 10 using three different lengths of blades will be explained in the second embodiment as follows. Referring to FIG. 3, different from the first embodiment, the second embodiment has a new length of a third blade 14. The first blade 12, second blade 13, and third blade 14 are arranged sequentially along the circumferential direction of the fan hub 11. The root portions of all the third blades 14 are all connected to the peripheral side of the fan hub 11. The head portions of all the first blades 12, the head portions of all the second blades 13, and the head portions of all the third blades 14 are all on the same circle 01. The length of the third blade 14 is less than the length of the second blade 13. The first outlet 02 defined by the first blade 12 and the front third blade 14 is wider, the second outlet 03 defined by the first blade 12 and the second blade 13 is narrower, and the third outlet 04 defined by the second blade 13 and the rear third blade 14 is the widest. The air velocity of the first outlet 02 is lower, the air velocity of the second outlet 03 is relatively higher, and the air velocity of the third outlet 04 is the lowest. The air velocity around the impeller 10 is distributed in a "weaker-stronger-weakest-weaker-stronger-weakest . . . " mode, breaking the consistency of the outlet airflow and causing differences in the air velocity. Similarly, the same effect as the first embodiment has been achieved.

Based on actual demands, more different lengths of blades may also be arranged on the impeller 10, the root portions of all the blades are connected to the side of fan hub 11, and the head portions of all the blades are located on the same circle 01. The blades of the impeller 10 are divided into a plurality of groups, and the lengths of the blades in the same group are different, which may also achieve the same effect as the first embodiment and the second embodiment.

The all blades all extended radially outward from the fan hub 11, and extended radially outward in a clockwise direction from the fan hub 11 as shown in FIG. 1. Each blade includes a first structural portion 05 extending in the first direction and a second structural portion 06 extending in the second direction from an end of the first structural part 05. An orientation of the first direction differs from the second direction. The specific orientated angles of the first and second directions are not strictly limited here, which may be set according to actual needs. This limitation is to roughly divide each blade into two parts, which makes the lengths of the blades in the same group different. Based on actual demands, one of the two adjacent blades may also be set as a straight blade, and the other of the two adjacent blades may be set as a curved blade. Alternatively, both adjacent blades can be set as curved blades, but with different bending angles, which also results in different lengths of blades within the same group. Preferably, a length ratio of two adjacent blades is A/B, and a value of A ranges from 102 to 110 and a value of B is 100. The width ratio of the first outlet 02 and the second outlet 03 is C/D, and the value of C ranges from 55 to 75 and the value of D ranges from 25 to 45. The width ratio of the second outlet 03 and the third outlet 04 is set as needed, which is not limited however.

Referring to FIG. 1 to FIG. 3, in another embodiment, the impeller of the present invention further includes a wheel ring 15. The wheel ring 15 is connected to the fan hub 11 through the blades and encloses the fan hub 11 on an outer circumference thereof. The blades are connected to an inner surface of the wheel ring 15. The wheel ring 15, the blades, and the fan hub 11 are formed into an integrated structure. Preferably, the impeller is formed by injection molding or powder metallurgy molding.

Figure 5:
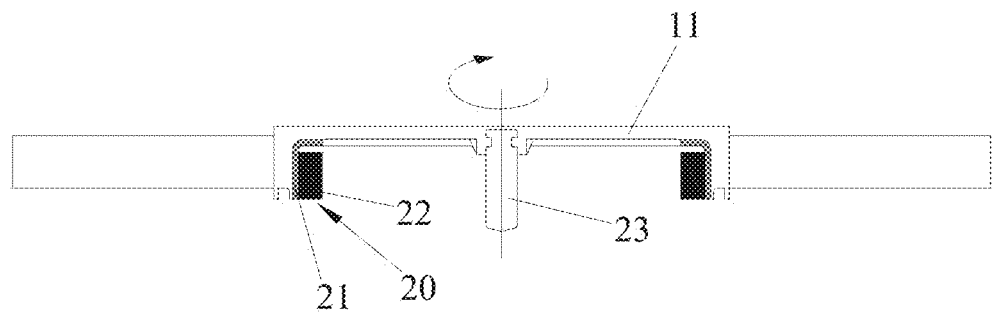
FIG. 5 is a sectional view showing the impeller installed on a magnetic component according to the present invention.

Referring to FIG. 5 the fan hub 11 is installed on the rotor of the motor, which is also named as magnetic component 20. The magnetic component 20 includes a magnet 21 and an iron shell 22. A shaft 23 of the motor is connected to the fan hub 11. The shaft 23 is made of plastic or metal.

Figure 6:
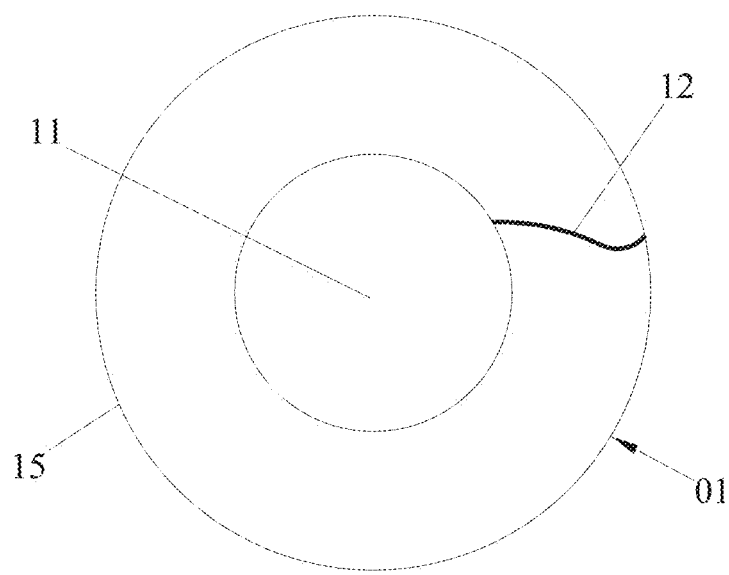
FIGS. 6 to 8 are schematic views showing the design process of the impeller according to the present invention.
Figure 7:
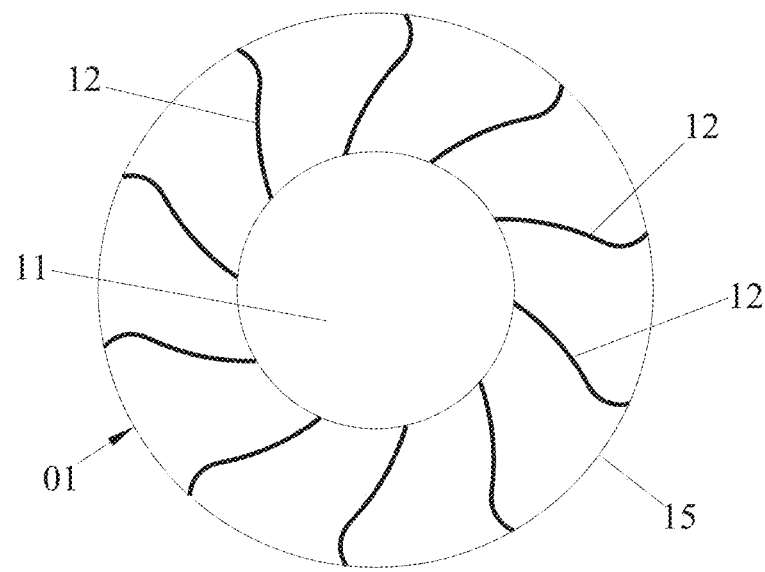
Figure 8:
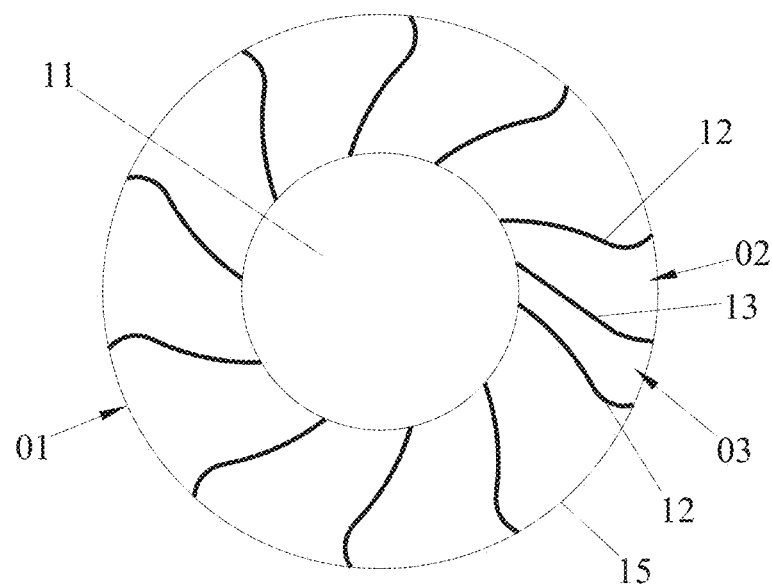

Referring to FIG. 6 to FIG. 8, the impeller 10 may be designed according to the following method. Provided that two types of blades, e.g. the first blade 12 and the second blade 13 are to be manufactured, it's preferred that the first blades 12 with half of the total number of the blades are firstly configured, as shown in FIG. 7. Then, the second blades 13 are configured between every two adjacent first blades 12. As illustrated in FIG. 8, only one second blade 13 is shown. In similar ways, other types (such as the third blade 14) of blades may be designed and manufactured.

To demonstrate that the impeller 10 provided in the present invention indeed has above advantages, a model test comparison is conducted on the impeller 10 of the present invention and a general impeller (represented as General design in the drawings). The general impeller has blades uniformly distributed and with the same lengths. The impeller of the present invention (represented as AB blade types in the drawings) has the same size and the same number of blades as the general impeller, but it includes two types of blades, e.g. the first blade 12 and the second blade 13, and the outlets for the two types of blades are also different.

Figure 9:
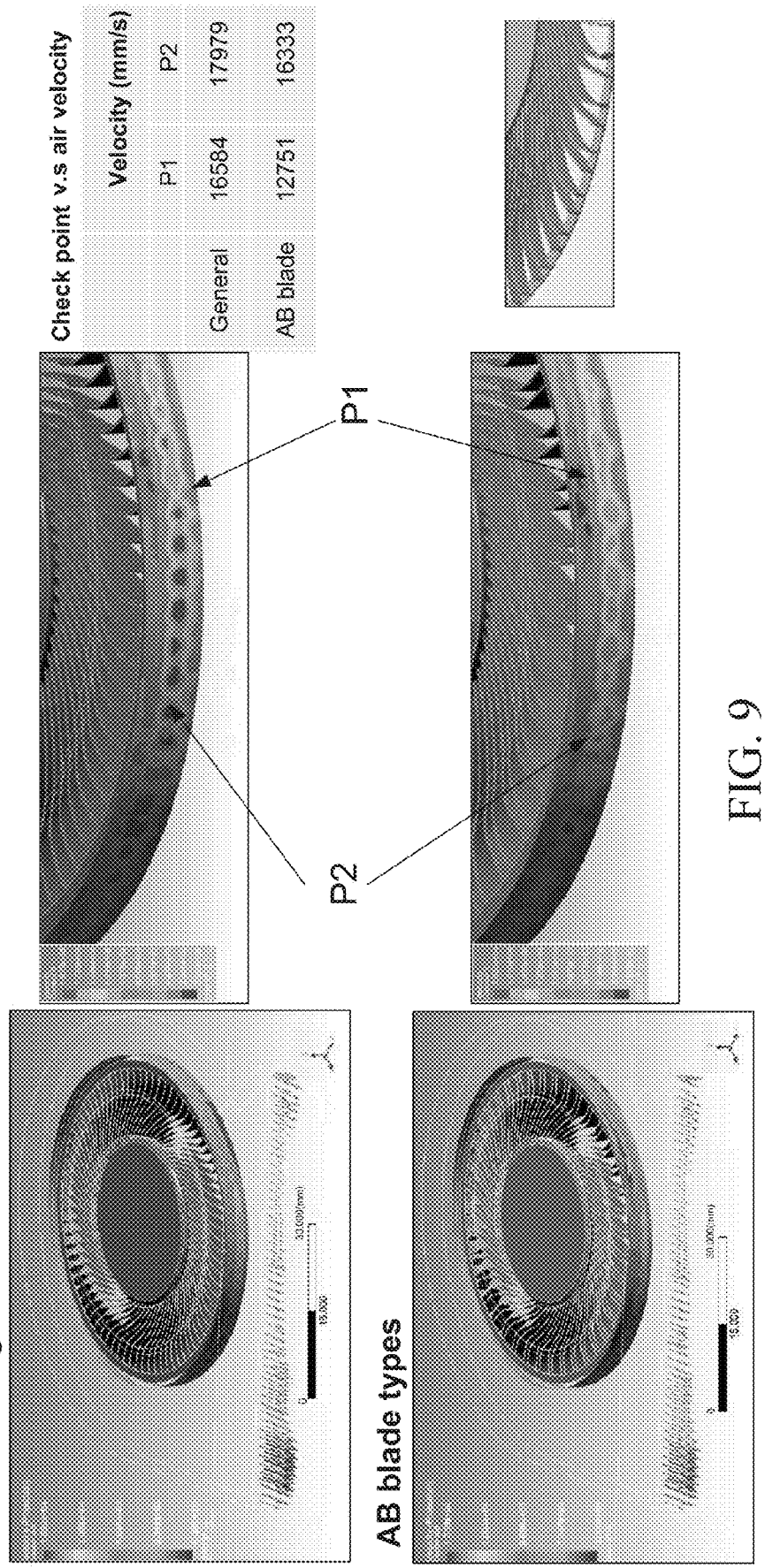
FIG. 9 is a comparative detection view showing the air flow velocity at corresponding outlets between the impeller of the present invention (AB blade types) and the existing impeller of general design.

The openings or outlets Pl and P2 of the two impellers are set as detection points. Referring to FIG. 9, the air velocity of the impeller of the present invention is lower than the general impeller at both openings P1 and P2. The impeller of the present invention may significantly suppress noise, as the air velocity is smaller.

Figure 11:
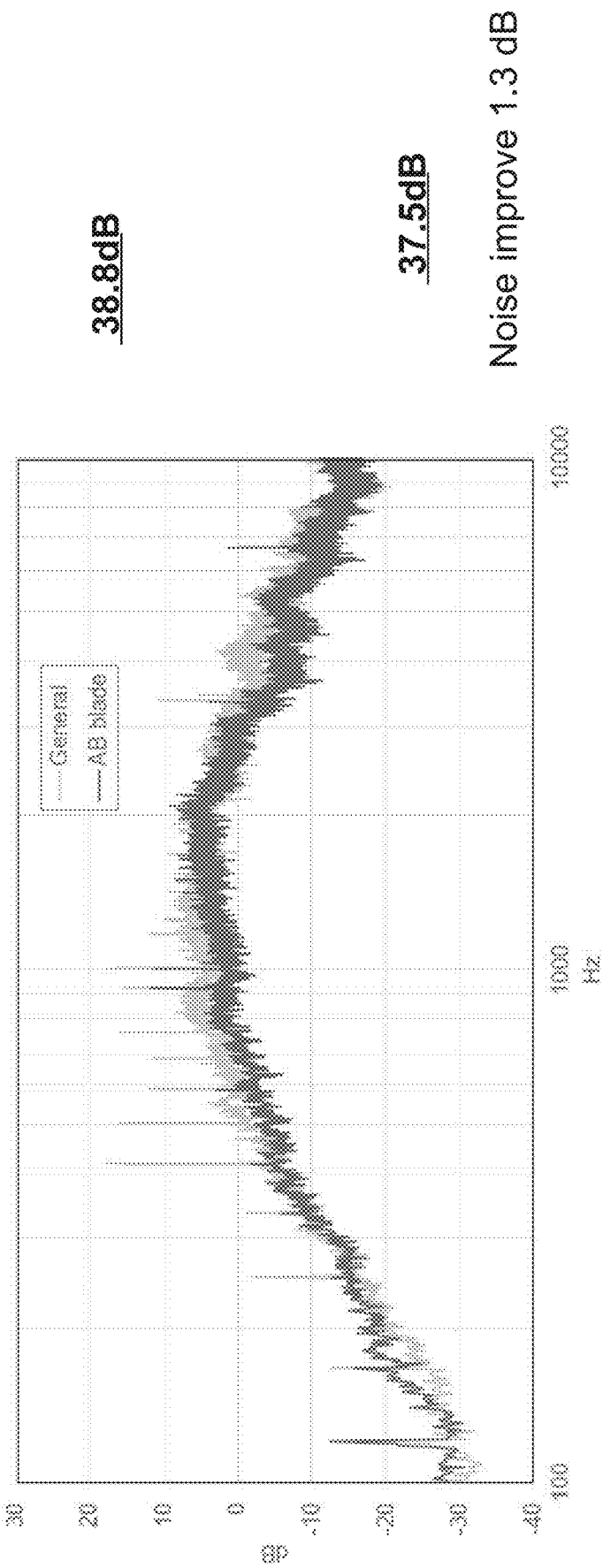
FIG. 11 shows the FFT spectrum of the impeller of the present application (AB blade types) and the existing impeller of general design at a speed of 5000 rpm.

In addition, referring to FIG. 11, the blades of the impeller 10 of the present invention may further effectively suppress noise. A comparison test is conducted on the impeller 10 of the present invention and the general impeller (represented as General design in the drawings) with a structural as shown in FIG. 4. The general impeller has blades uniformly distributed and with the same lengths. The impeller of the present invention (represented as AB blade types in the drawings) has the same size and the same number of blades as a general impeller, but it includes two types of blades, e.g. the first blade 12 and the second blade 13, and the outlets for the two types of blades are also different.

Figure 10:
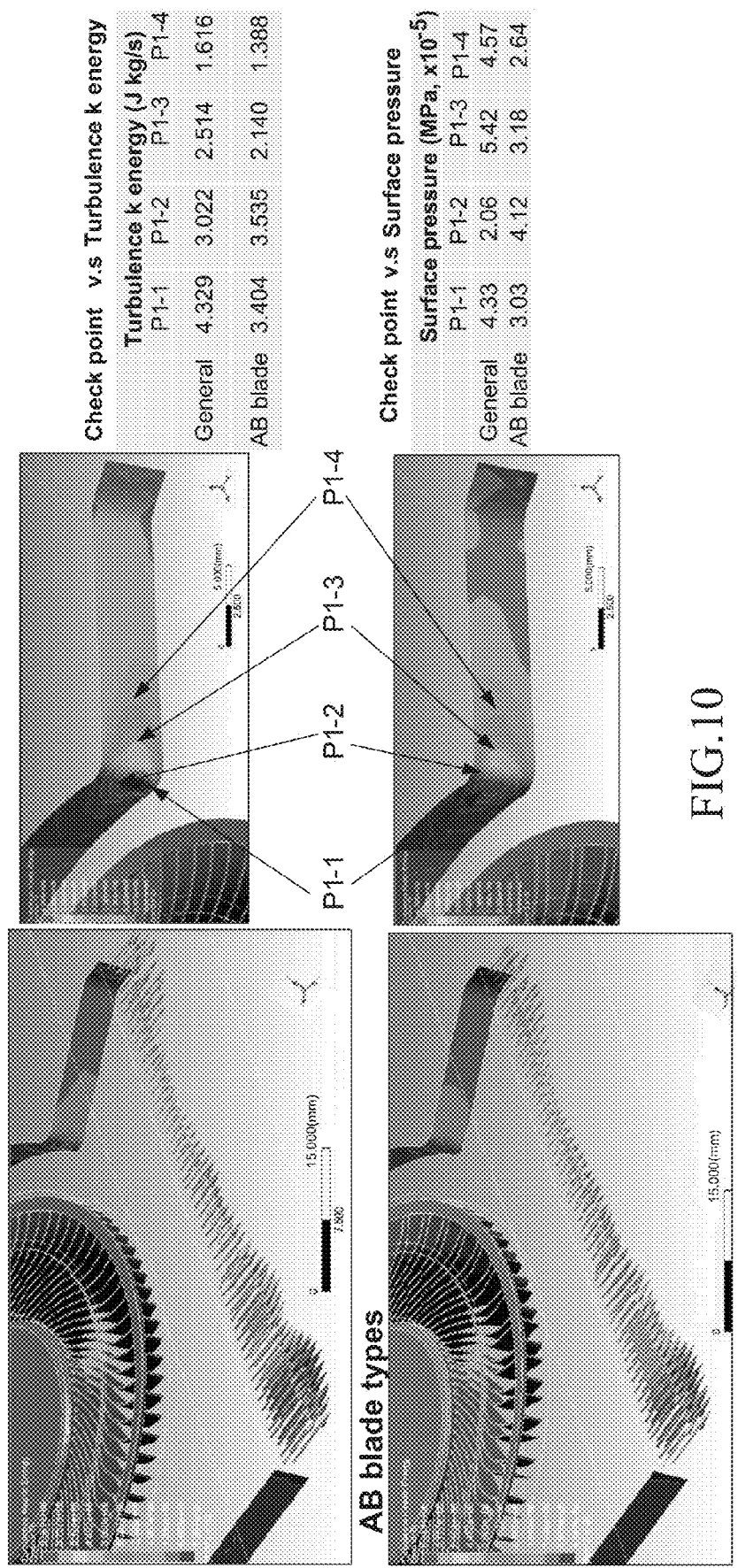
FIG. 10 is a comparative detection view showing turbulent kinetic energy and surface pressure at corresponding positions of blades of the impeller between the impeller of the present invention (AB blade types) and the existing impeller of general design.

At the same positions on the blade, four detection points are taken and named as P1-1, P1-2, P1-3 and P1-4, at which turbulence k energy and surface pressure values are measured. Referring to FIG. 10, compared to general design, the turbulence kinetic energy and surface pressure at the four detection points on the blades of the present invention are significantly reduced, and the values of turbulence kinetic energy and surface pressure are smaller, indicating that less noise is generated when the frequency of the working blades is lower.

In addition, when gauging the FFT spectrum at a speed of 5000 rpm, the smaller the spectrum value, the lower the noise. Compared to the existing general impeller (represented as General design in the drawings), the noise value of the impeller (represented as AB blade types in the drawings) of the present invention is smaller.

Figure 13:
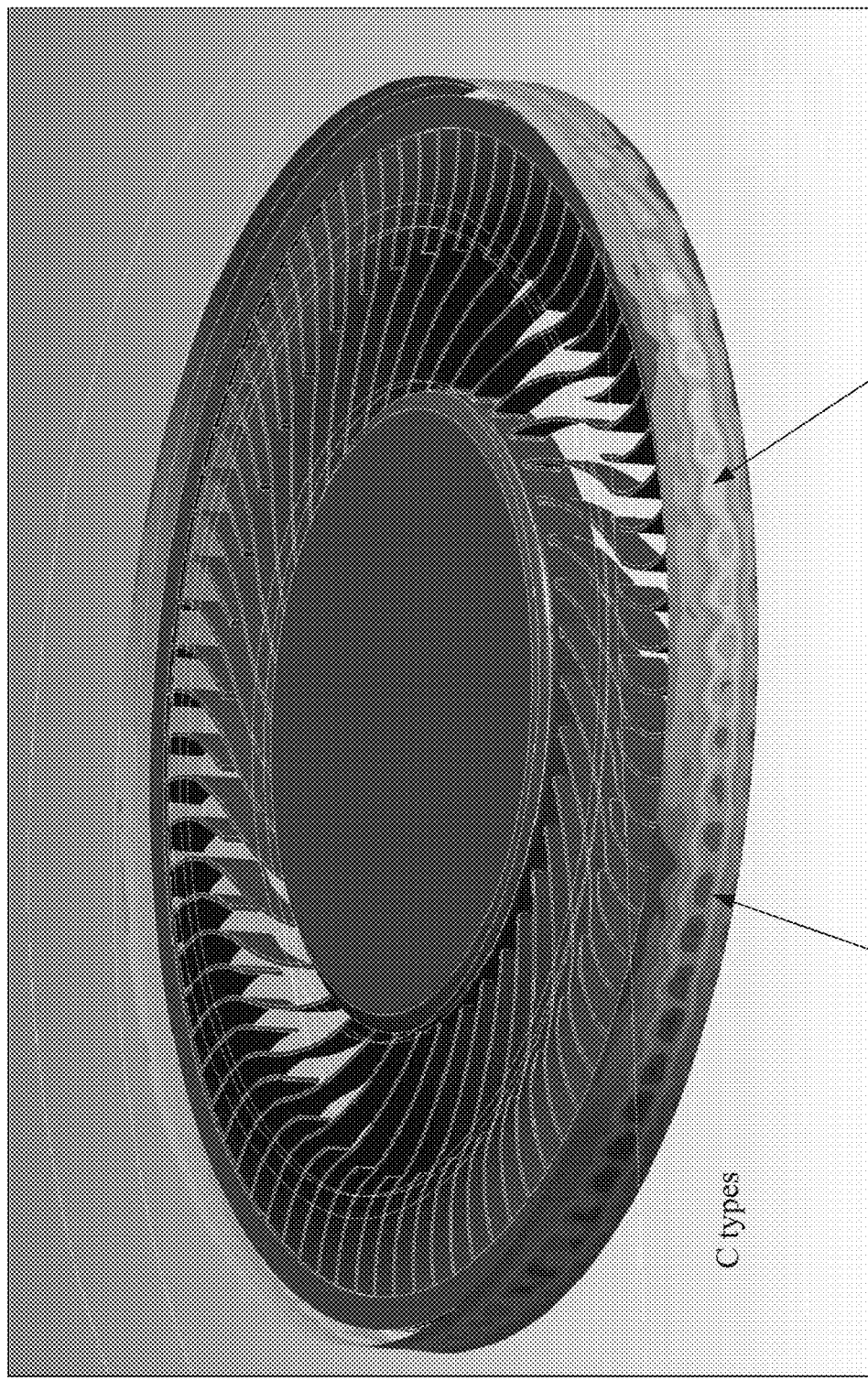
FIG. 13 is a detection view showing air velocities at outlets P1 and P2 of another existing impeller (C types) according to the prior art.

In addition, in general, the lower the air velocity from the outlets is, the lower the noise is. After comparison, compared to the impeller with equal-length blades, or the impeller with different-length blades (e.g. long blades and short blades) where the short blades not simultaneously connected to the fan hub or wheel ring (as shown in FIG. 13, represented as C types in the drawings), the impeller of the present invention shown as AB blade types in FIG. 9 are significantly reduced in air velocity, thereby reducing the noise.

Figure 12:
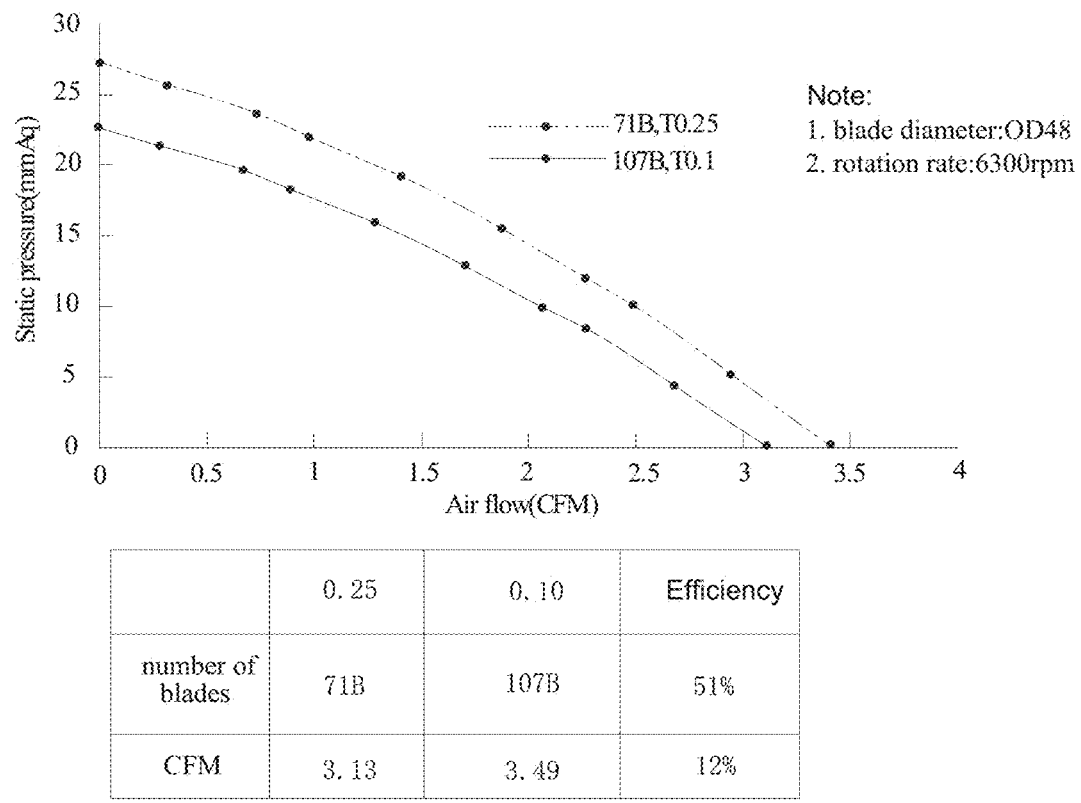
FIG. 12 is an experimental diagram of performance comparison of the number of blades, flow rate, and static pressure between the impeller of the present invention (AB blade types) and the existing impeller of general design.

As mentioned above, the more blades the impeller has, the more air volume it generates during operation, the more helpful for heat dissipation. In order to accommodate more blades, the thickness of the blades in the present invention is limited in a range from 0.08 mm to 2.0 mm. It can be understood that, more blades may be configured when the blade is thinner. Referring to FIG. 12, in comparison the blades with thickness of 0.25 mm with those with thickness of 0.1 mm, the total number of blades is increased from 71 to 107, with the efficiency improved by 51%; the flow volume (CFM) is increased from 3.13 to 3.49, with the efficiency improved by 12%. When more blades are configured, higher flow rate and greater air volume is obtained, the heat dissipation is improved. Referring to the curve in FIG. 12, at a limited speed of 6300 rpm, under the same output flow rate, the static pressure of the impeller 10 with more blades is lower, which is beneficial for noise reduction, and under the same static pressure, the output flow rate of impeller 10 with more blades is higher, which is beneficial for increasing air volume and improving heat dissipation efficiency. The above explanation shows that by adopting the scheme of the present invention, more blades may be configured when the thickness of the blades is set within the range from 0.08 mm to 2.0 mm, which is beneficial for increasing the output flow rate of the impeller and suppressing the noise of the blades.

The above disclosure is only a preferred example of the present invention and cannot be used to limit the scope of rights of the present invention. Therefore, any equivalent changes made in accordance with the claims of the present invention are within the scope of the present invention.

What is claimed is:

1. An impeller comprising:
a fan hub; and
a plurality of blades, the blades being positioned at intervals around the fan hub and arranged in a circular array, the blades extending radially outward from the fan hub, two opposite ends of each of the blades being a root portion and a head portion respectively, all root portions of the blades being connected to a peripheral side of the fan hub, all head portions of the blades being located on a same circle, every two adjacent blades of said blades being different in length in a longitudinal direction from the root portion thereof to the head portion thereof;
wherein one of the two adjacent blades is straight, and the other of the two adjacent blades is curved;
an outlet is defined between the head portions of every two adjacent blades of said blades, and any two adjacent outlets are different in width in a circumferential direction;
the blades comprise three types of blades including a first blade, a second blade and a third blade arranged sequentially along the circumferential direction of the fan hub, a length of the first blade is greater than that of the second blade, a length of the third blade is less than that of the second blade, a narrowest outlet is defined between the first blade and the second blade, and a widest outlet is defined between the second blade and the third blade.

2. The impeller according to claim 1, wherein each of the blades which are curved comprises a first structural part extending along a first direction and a second structural part extending from an end of the first structural part to a second direction, and the first direction is different from the second direction.

3. The impeller according to claim 1, wherein a length ratio of the two adjacent blades is A/B, where a value of A ranges from 102 to 110, and a value of B is 100.

4. The impeller according to claim 1, wherein the two adjacent outlets are named as a first outlet and a second outlet respectively, a width ratio of the first outlet and the second outlet is C/D, where a value of C ranges from 55 to 75, and a value of D ranges from 25 to 45.

5. The impeller according to claim 1, wherein a thickness of each of the blades is in a range from 0.08 mm to 2.0 mm.

6. The impeller according to claim 1, wherein the blades comprises more than three types of blades with different lengths.

7. The impeller according to claim 1, wherein the number of the blades for each type of the blades is the same amount.

8. The impeller according to claim 1, wherein the impeller further comprises a wheel ring, the wheel ring is connected to the fan hub through the blades and encloses the fan hub on an outer circumference thereof, the blades are connected to an inner surface of the wheel ring, the wheel ring, the fan hub, and the blades are formed into an integrated structure.

9. A fan, comprising an impeller and a motor with a shaft to drive the impeller rotation, wherein the impeller comprises:
a fan hub installed on the shaft of the motor; and
a plurality of blades, the blades being positioned at intervals around the fan hub and arranged in a circular array, the blades extending radially outward from the fan hub, two opposite ends of each of the blades being a root portion and a head portion respectively, all root portions of the blades being connected to a peripheral side of the fan hub, all head portions of the blades being located on a same circle, every two adjacent blades of said blades being different in length in a longitudinal direction from the root portion thereof to the head portion thereof;
wherein one of the two adjacent blades is straight, and the other of the two adjacent blades is curved;
an outlet is defined between the head portions of every two adjacent blades of said blades, and any two adjacent outlets are different in width in a circumferential direction;
the blades comprise three types of blades including a first blade, a second blade and a third blade arranged sequentially along the circumferential direction of the fan hub, a length of the first blade is greater than that of the second blade, a length of the third blade is less than that of the second blade, a narrowest outlet is defined between the first blade and the second blade, and a widest outlet is defined between the second blade and the third blade.

10. The fan according to claim 9, wherein each of the blades which are curved comprises a first structural part extending along a first direction and a second structural part extending from an end of the first structural part to a second direction, and the first direction is different from the second direction.

11. The fan according to claim 9, wherein a length ratio of the two adjacent blades is A/B, where a value of A ranges from 102 to 110, and a value of B is 100.

12. The fan according to claim 9, wherein the two adjacent outlets are named as a first outlet and a second outlet respectively, a width ratio of the first outlet and the second outlet is C/D, where a value of C ranges from 55 to 75, and a value of D ranges from 25 to 45.

13. The fan according to claim 9, wherein a thickness of each of the blades is in a range from 0.08 mm to 2.0 mm.

14. The fan according to claim 9, wherein the number of the blades for each type of the blades is the same amount.

15. The fan according to claim 9, wherein the impeller further comprises a wheel ring, the wheel ring is connected to the fan hub through the blades and encloses the fan hub on an outer circumference thereof, the blades are connected to an inner surface of the wheel ring, the wheel ring, the fan hub, and the blades are formed into an integrated structure.

16. An electronic device, comprising:
a heating device, and
a fan, comprising an impeller and a motor with a shaft to drive the impeller rotation for dissipating heat from the heating device, wherein the impeller comprises:
a fan hub installed on the shaft of the motor; and
a plurality of blades, the blades being positioned at intervals around the fan hub and arranged in a circular array, the blades extending radially outward from the fan hub, two opposite ends of each of the blades being a root portion and a head portion respectively, all root portions of the blades being connected to a peripheral side of the fan hub, all head portions of the blades being located on a same circle, every two adjacent blades of said blades being different in length in a longitudinal direction from the root portion thereof to the head portion thereof;
wherein one of the two adjacent blades is straight, and the other of the two adjacent blades is curved;
an outlet is defined between the head portions of every two adjacent blades of said blades, and any two adjacent outlets are different in width in a circumferential direction;
the blades comprise three types of blades including a first blade, a second blade and a third blade arranged sequentially along the circumferential direction of the fan hub, a length of the first blade is greater than that of the second blade, a length of the third blade is less than that of the second blade, a narrowest outlet is defined between the first blade and the second blade, and a widest outlet is defined between the second blade and the third blade.

\* \* \* \* \*